United States Patent [19]

Walters, Jr.

[11] Patent Number: 4,806,794
[45] Date of Patent: Feb. 21, 1989

[54] FAST, LOW-NOISE CMOS OUTPUT BUFFER

[75] Inventor: Donald M. Walters, Jr., Austin, Tex.

[73] Assignee: Advanced Micro Devices, Inc., Sunnyvale, Calif.

[21] Appl. No.: 76,566

[22] Filed: Jul. 22, 1987

[51] Int. Cl.$^4$ .................. H03K 19/094; H03K 17/16; H03K 19/20

[52] U.S. Cl. .................... 307/451; 307/443; 307/445; 307/473; 367/272.1

[58] Field of Search ............... 307/443, 445, 448, 473, 307/451, 272 R, 446

[56] References Cited

U.S. PATENT DOCUMENTS 3,912,947 10/1975 Buchanan ........................ 307/473

OTHER PUBLICATIONS

IBM Tech. Disc. Bul. "Off-Chip Driver" Askin.
IBM Tech. Disc. Bul. "Receiver for Pseudo-Clocked Cascade Voltage Switch Logic".

Primary Examiner—John S. Heyman
Assistant Examiner—M. R. Wambach
Attorney, Agent, or Firm—Davis Chin

[57] ABSTRACT

A CMOS output buffer includes a transient pull-up circuit, a transient pull-down circuit and a keeper circuit. The pull-up circuit is responsive to a high drive enable pulse signal for generating a transition from a low logic level to a high logic level at an output node. The pull-down circuit is responsive to a low drive enable pulse signal for generating a transition from the high logic level to the low logic level at the output node. The keeper circuit is responsive to the high and low drive enable pulse signals so as to maintain the output node at the high logic level after the output node has made the low-to-high transition and to maintain the output node at the low logic level after the output node has made the high-to-low transition. The CMOS output buffer has a high speed of operation and has a high immunity to noise.

19 Claims, 5 Drawing Sheets

OUTPUT BUFFER

OUTPUT BUFFER

ALTERNATIVE EMBODIMENT

ALTERNATIVE EMBODIMENT WITH SEPARATE LOW HOLDING SUPPLY VOLTAGE (HVSS)

ALTERNATIVE EMBODIMENT WITH
REDUCED COST/PERFORMANCE
RATIO.

FAST, LOW-NOISE CMOS OUTPUT BUFFER

BACKGROUND OF THE INVENTION

This invention relates generally to complementary metal-oxide-semiconductor (CMOS) output buffer circuits and more particularly, it relates an improved CMOS output buffer which has a higher speed of operation and has a high immunity to noise.

In common practice, it is often required to use more than a single circuit type or logic type in an electrical system. For example, a complementary metal-oxide-semiconductor (CMOS) central processing unit may interface through buses with peripheral units adapted to receive transistor-transistor-logic (TTL) logic levels. Thus, there have been provided heretofore output buffer circuits which enable circuits to receive CMOS logic levels and to provide output signals that are TTL compatible. However, one disadvantage of these prior art output buffer circuits is that they produce output signals which were susceptible to oscillations (inductive ringing) caused by noise on a supply bus line or a ground bus line of an integrated circuit device or cross-talk, thereby reducing its speed of operation and/or causing an erroneous output.

It would therefore be desirable to provide an improved CMOS output buffer having minimal ringing or cross-talk in its output signals. It would also be expedient to provide such a CMOS output buffer which has low propagation delays, thereby rendering a fast speed of operation.

SUMMARY OF THE INVENTION

Accordingly, it is a general object of the present invention to provide an improved CMOS output buffer which is relatively simple and economical to manufacture and assemble, but yet overcomes the disadvantages of the prior art output buffers.

It is an object of the present invention to provide an improved CMOS output buffer which has minimal ringing or cross-talk in its output signals.

It is another object of the present invention to provide an improved CMOS output buffer which has low propagation delays and has a high immunity to noise, thereby rendering a fast speed of operation.

It is still another object of the present invention to provide a CMOS output buffer which includes a transient pull-up circuit, a transient pull-down circuit, and a keeper circuit.

It is still yet another object of the present invention to provide a CMOS output buffer formed of a keeper circuit which includes a delay circuit responsive to high and low drive enable pulse signals for delaying the turn-on of an N-channel output driver transistor in the keeper circuit until after the output node has made a high-to-low transition.

In accordance with these aims and objectives, the present invention is concerned with the provision of an improved CMOS output buffer which includes a transient pull-up circuit, a transient pull-down circuit, and a keeper circuit. The pull-up circuit is responsive to a high drive enable pulse signal for generating a transition from a low logic level to a high logic level at an output node. The pull-down circuit is responsive to a low drive enable pulse signal for generating a transition from a high logic level to a low logic level at the output node. The keeper circuit is responsive to the high and low drive enable pulse signals for maintaining the output node at the high logic level after the output node has made the low-to-high transition and for maintaining the output node at the low logic level after the output node has made the high-to-low transition.

The pull-up circuit includes a transient pull-up output driver transistor which has one of its main electrodes connected to a high transient supply voltage, its other main electrode connected to the output node, and its control electrode coupled to receive the high drive enable pulse signal. The pull-down circuit includes either one or two transient pull-down output driver transistors each having one of its main electrodes connected to a low transient supply voltage, its other main electrode connected to the output node, and its control electrode coupled to receive the low drive enable pulse signal. The keeper circuit is formed of a P-channel output driver MOS transistor and an N-channel output driver MOS transistor.

The keeper circuit further includes a latching delay circuit responsive to the high and low drive enable pulse signals for delaying the turn-on of the N-channel output driver transistor until after the output node has made the high-to-low transition. The P-channel output driver transistor has its source connected to a supply potential, its drain connected to the output node, and its gate coupled to a first output of the delay circuit. The N-channel output driver transistor has its drain connected to the output node, its source connected to a holding low supply potential, and its gate coupled to a second output of the delay circuit. The keeper circuit further includes a speed-up circuit responsive to the high drive enable pulse signal for quickly turning off the N-channel output driver transistor when the output node is making the low-to-high transition.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
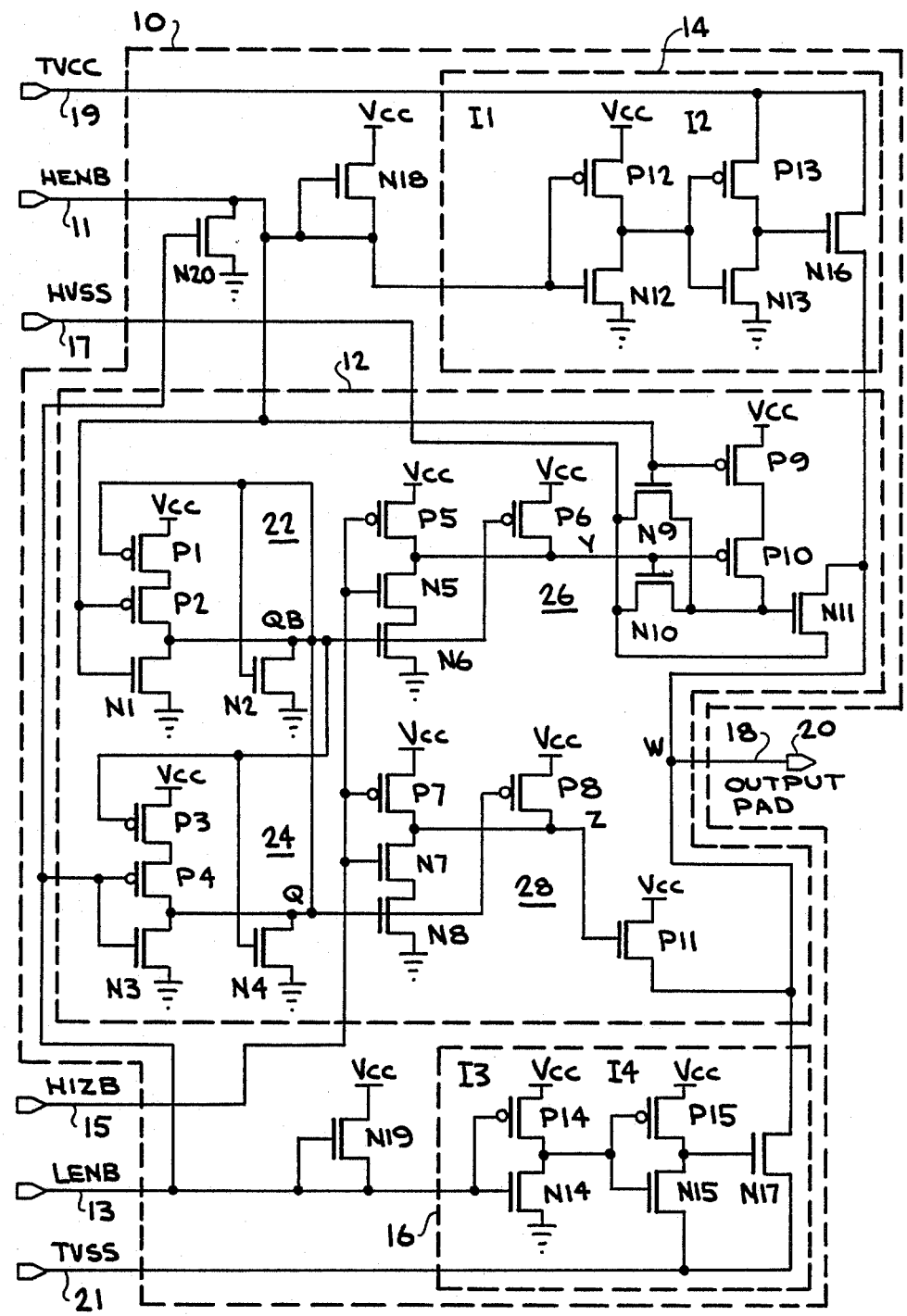
FIG. 1 is a schematic circuit diagram of a CMOS output circuit constructed in accordance with the principles of the present invention.

Referring now to the drawings, there is shown in FIG. 1 a schematic circuit diagram of a fast, low-noise CMOS output buffer 10 of the present invention. The output buffer 10 includes a keeper circuit 12, a transient pull-up circuit 14, and a transient pull-down circuit 16. The output of the keeper circuit 12 on line 18 at node W is connected to an output pad 20, which is driven to a high or logic "1" level or a low or logic "0" level in response to input signals consisting of a high drive enable pulse signal HENB on line 11 and a low drive enable pulse signal LENB on line 13. When it is desired to drive the output pad 20 to a high state, the high drive enable pulse signal HENB is asserted, i.e., HENB=1. When it is desired to drive the pad 20 to a low state, the low drive enable pulse signal LENB is asserted, i.e., LENB=1. However, it should be noted that both pulse signals HENB and LENB are not to be asserted simultaneously.

The keeper circuit 12 includes a R-S flip-flop or latch formed of a first NOR logic gate 22 and a second NOR logic gate 24. The first logic gate 22 consists of a P-channel MOS transistor P1, a P-channel MOS transistor P2, an N-channel MOS transistor N1 and an N-channel MOS transistor N2. The transistor P1 has its source connected to a supply voltage or potential VCC (typically +5.0 volts), its gate connected to the gate of the transistor N2, and its drain connected to the source of the transistor P2. The transistor P2 has its gate connected to the gate of the transistor N1 and to the pulse signal HENB and its drain connected to the drain of the transistor N1. The transistor N1 has its source connected to a ground potential. The transistor N2 has its drain connected to the drain of the transistor N1 and its source connected also to the ground potential. The common gates of the transistors P2 and N1 define a first input of the logic gate 22, and the common gates of the transistors P1 and N2 define a second input of the logic gate 22. The common drains of the transistors N1 and N2 define the output QB of the logic gate 22.

Similarly, the second logic gate 24 consists of a P-channel MOS transistor P3, a P-channel MOS transistor P4, an N-channel MOS transistor N3, and an N-channel MOS transistor N4. The transistor P3 has its source connected to the supply potential, its gate connected to the gate of the transistor N4, and its drain connected to the source of the transistor P4. The transistor P4 has its gate connected to the gate of the transistor N3 and to the pulse signal LENB and its drain connected to the drain of the transistor N3. The transistor N3 has its source connected to the ground potential. The transistor N4 has its drain connected to the drain of the transistor N3 and its source connected also to the ground potential. The common gates of the transistors P4 and N3 define a first input of the logic gate 24, and the common gates of the transistors P3 and N4 define a second input of the logic gate 24. The common drains of the transistors N3 and N4 define the output Q of the logic gate 24.

The first input of the logic gate 22 is connected to the line 11 for receiving the pulse signal HENB, and the second input of the logic gate 22 is connected to the output Q of the logic gate 24. The first input of the logic gate 24 is connected to the line 13 for receiving the pulse signal LENB, and the second input of the logic gate 24 is connected to the output QB of the logic gate 22.

The keeper circuit 12 further includes a first NAND logic gate 26 and a second NAND logic gate 28. The logic gate 26 consists of a P-channel MOS transistor P5, a P-channel MOS transistor P6, an N-channel MOS transistor N5, and an N-channel MOS transistor N6. The transistor P5 has its source connected to the supply potential VCC, its gate connected to a high impedance control signal HIZB on line 15, and its drain connected to the drain of the transistor N5. The transistor P6 has its source connected also to the supply potential VCC, its gate connected to the output QB of logic gate 22, and its drain connected to the drain of the transistor P5. The transistor N5 has its drain connected to the common drains of the transistors P5 and P6, its gate connected to the high impedance signal HIZB, and its source connected to the drain of the transistor N6. The transistor N6 has its gate connected to the gate of the transistor P6 and its source connected to the ground potential. The common gates of the transistors P5 and N5 define a first input of the logic gate 26, and the common gates of the transistors P6 and N6 define a second input of the logic gate 26. The common drains of the transistors P5 and P6 define the output of the logic gate 26 at node Y.

Similarly, the logic gate 28 consists of a P-channel MOS transistor P7, a P-channel MOS transistor P8, an N-channel MOS transistor N7, and an N-channel MOS transistor N8. The transistor P7 has its source connected to the supply potential VCC, its gate connected to the high impedance control signal HIZB on the line 15, and its drain connected to the drain of the transistor N7. The transistor P8 has its source connected to the supply potential VCC, its gate connected to the output Q of the logic gate 24, and its drain connected to the drain of the transistor P7. The transistor N7 has its drain connected to the common drains of the transistors P7 and P8, its gate connected to the high impedance control signal HIZB, and its source connected to the drain of the transistor N8. The transistor N8 has its gate connected to the gate of the transistor P8 and its source connected to the ground potential. The common gates of the transistors P7 and N7 define a first input of the logic gate 28, and the common gates of the transistors P8 and N8 define a second input of the logic gate 28. The common drains of the transistors P7 and P8 define the output of the logic gate 28 at node Z.

The first input of the logic gate 26 is connected to the line 15 for receiving the high impedance signal HIZB, and the second input of the logic gate 26 is connected to the output QB of the logic gate 22. The first input of the logic gate 28 is also connected to the line 15 for receiving the high impedance control signal HIZB, and the second input of the logic gate 28 is connected to the output Q of the logic gate 24.

The keeper circuit 12 further includes a first keeper output driver device formed of a P-channel MOS transistor P11 and a second keeper output driver device formed of an N-channel MOS transistor N11. The second keeper output driver transistor N11 has associated with it speed-up circuit means which is responsive to the pulse signal HENB for quickly turning off the transistor N11 when the output node W is making the low-to-high transition. The speed-up circuit means consists of a pair of N-channel MOS transistors N9, N10 and a pair of P-channel MOS transistors P9, P10. The gates of the transistors P9 and N9 and connected together and to the pulse signal HENB on the line 11. The transistor P9 has its source connected to the supply potential VCC and its drain connected to the source of the transistor P10. The gates of the transistors P10 and N10 are connected together and to the output at the node Y of the logic gate 26. The transistor P10 has its drain connected to the common drains of the transistors N9 and N10 and to the gate of the transistor N11. The sources of the transistors N9 and N10 are also connected together and to a line 17 for receiving a holding low supply voltage HVSS, typically zero volts.

The first keeper output driver transistor P11 has its source connected to the supply potential VCC, its gate connected to the output at the node Z of the logic gate 28 and its drain connected to the drain of the transistor N11 at the output node W. The second keeper output driver transistor N11 has its source connected to the holding low supply voltage HVSS on the line 17. The common drains of the transistors P11 and N11 are further connected to the output pad 20 via the line 18. The pad 20 defines the output of the output buffer 10.

The transient pull-up circuit 14 includes a first CMOS inverter I1 formed of a P-channel MOS transistor P12 and an N-channel MOS transistor N12, a second CMOS inverter I2 formed of a P-channel MOS transistor P13 and an N-channel MOS transistor N13, and a transient pull-up output driver device formed of an N-channel MOS transistor N16. The common gates of the transistors P12 and N12 define the input of the first inverter I1 and is connected to the line 11 for receiving the pulse signal HENB. The common drains of the transistors P12 and N12 define the output of the first inverter I1 and is connected to the common gates of the transistors P13 and N13 defining the input of the second inverter I2. The common drains of the transistors P13 and N13 define the output of the second inverter I2 and is connected to the gate of the pull-up output driver transistor N16. The transistor N16 has its source connected to a line 19 for receiving a high transient supply voltage TVCC, typically at +5.0 volts, and its drain connected to the drain of the second keeper output driver transistor N11.

The transient pull-down circuit 16 includes a third CMOS inverter I3 formed of a P-channel MOS transistor P14 and an N-channel MOS transistor N14, a fourth CMOS inverter I4 formed of a P-channel MOS transistor P15 and an N-channel MOS transistor N15, and a transient pull-down output driver device formed of an N-channel MOS transistor N17. The common gates of the transistors P14 and N14 define the input of the third inverter I3 and is connected to the line 13 for receiving the pulse signal LENB. The common drains of the transistors P14 and N14 define the output of the third inverter I3 and is connected to the common gates of the transistors P15 and N15 defining the input of the fourth inverter I4. The common drains of the transistors P15 and N15 define the output of the fourth inverter I4 and is connected to the gate of the pull-down output driver transistor N17. Transistor N17 has its source connected to a line 21 for receiving a low transient supply voltage TVSS, typically zero volts, and its drain connected to the drain of the first keeper output driver transistor P11.

The output buffer 10 further includes a first diode-connected N-channel MOS transistor N18 and a second diode-connected N-channel MOS transistor N19. The transistor N18 has its drain connected to the supply potential VCC and its gate and source connected to the line 11 for receiving the pulse signal HENB. The transistor N18 functions as a diode to prevent the pulse signal HENB from exceeding more than one MOSFET voltage threshold, $V_T$, above the ground potential immediately prior to power-up. Similarly, the transistor N19 functions as a diode to prevent the pulse signal LENB from exceeding more than one MOSFET voltage threshold, $V_T$, above the ground potential immediately prior to power-up.

The output buffer 10 further includes an N-channel MOS transistor N20 which has its drain connected to the line 11, its gate connected to the line 13, and its source connected to the ground potential. The transistor N20 functions to prevent conflicting drive signals from being applied to the output pad 20 due to the simultaneous assertion of a high logic level on both lines 11 and 13 during power-up. In the event that this condition occurs, the transistor N20 is designed to ratio the pulse signal HENB so that it will be pulled to a low logic level, thereby preventing a conflicting drive at the node W.

As previously discussed, either the pulse signal HENB or LENB is asserted to drive the output pad 20 to a respective high or low logic state, but they are not to be asserted simultaneously. When the pulse signals HENB and LENB are low and the high impedance signal HIZB is asserted (HIZB=LOW), all transistors with drains tied to the node W (N16, N17, P11 and N11) are turned off so as to maintain the output node W and the pad 20 at a high impedance state. While the buffer 10 is enabled to drive the pad 20, the high impedance signal HIZB will not be asserted (HIZB=HIGH) so as to permit the keeper circuit 12 to be responsive to the pulse signals HENB and LENB.

Figure 2:
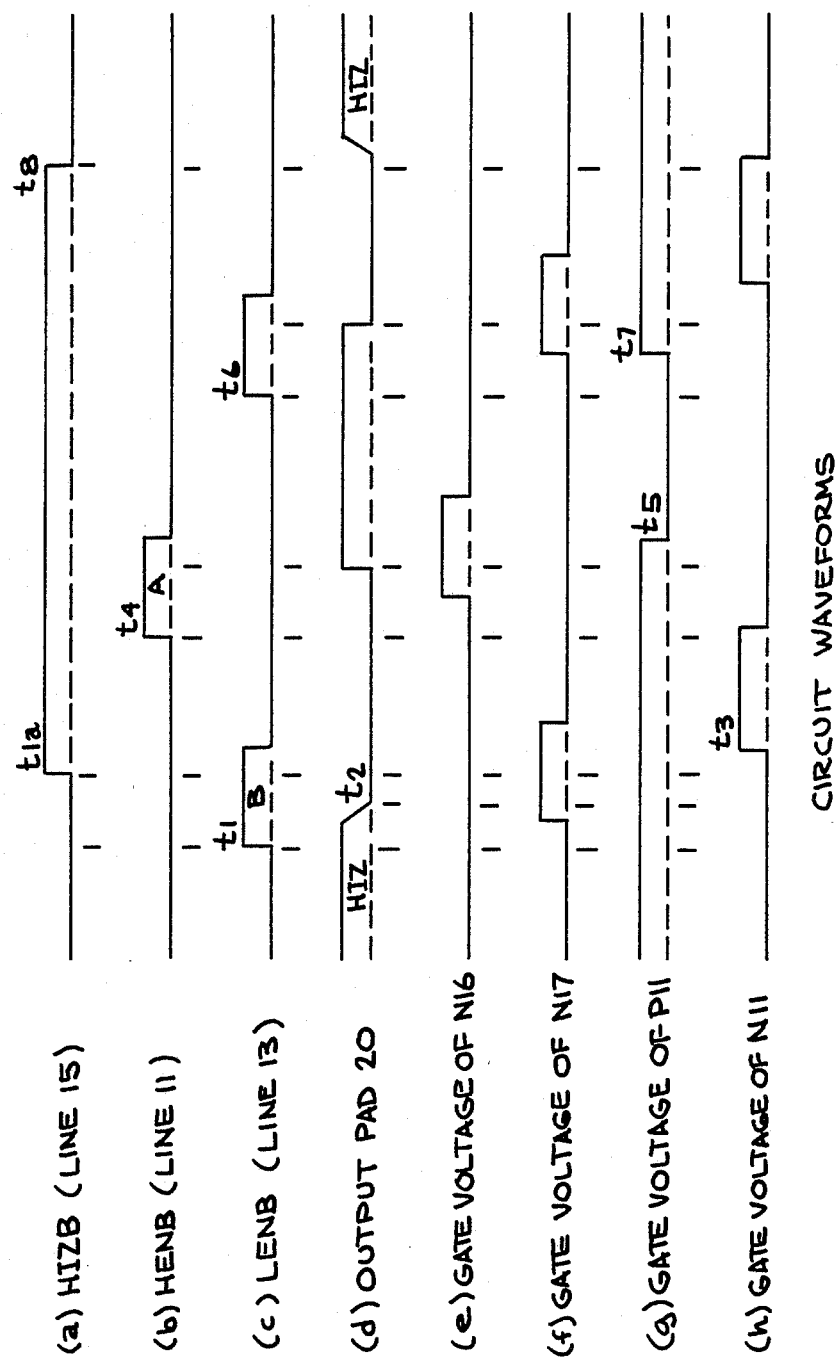
FIGS. 2(a)-2(h) are waveforms at various points in the circuit of FIG. 1, which are useful in understanding the operation thereof.

In order to provide an understanding of the operation of the fast, low-noise CMOS buffer 10 of the present invention, reference is now made to FIGS. 2(a)–2(h) of the drawings which illustrate the waveforms appearing at various points in the buffer circuit of FIG. 1. Initially, it is assumed that the high impedance signal HIZB is not being asserted (HIZB=HIGH) for times t1a to t8. This is shown in FIG. 2(a). Further, it is assumed that the first keeper output driver transistor P11 is turned off, the second keeper output driver device N11 is turned off, and the transistors N16 and N17 are also turned off. This is illustrated in FIGS. 2(e) through 2(h), respectively. Under this condition, the output node W is at an indeterminate, high impedance logic state, as can be seen from FIG. 2(d).

When the low drive pulse enable signal LENB is asserted (LENB=HIGH) at the time t1, the transient pull-down output driver transistor N17 is quickly turned on and the transient pull-up output driver transistor N16 will remain off. This is depicted in FIGS. 2(f) and 2(e). This avoids common currents in the transistors N16 and N17 due to their simultaneous conduction, thereby reducing parasitic loading and propagation delay. With the transistor N17 being turned on, it performs the "pull-down" function by providing a current path to the low transient supply voltage TVSS, which pulls the output node W and the pad 20 to a low logic level. This is shown at the time t2 in FIG. 2(d). At this point, the second keeper output driver transistor N11 has not begun to turn on. Thus, noise spikes generated on the low transient supply voltage TVSS in the line 21 during the high-to-low transition will be isolated from the holding low supply voltage HVSS in the keeper circuit by the transistor N11.

Thereafter, at the time t3 (FIG. 4(h)) the transistor N11 will be turned on after the output node W or pad 20 has already made the high-to-low transition. The logic gates 22, 24, 26 and the keeper circuit speed-up means (devices N9, P9, N10, and P10) serve as a delay means for delaying the turning on of the transistor N11 since the pulse signal LENB has to travel through these logic gates before reaching the gate of the transistor N11.

When the pulse signal HENB is asserted (HENB=1) at the time t4, the transient pull-up output driver transistor N16 will quickly turn on and the transistor N17 will remain off. This can be seen from FIGS. 2(b), 2(e) and 2(f). This again avoids common currents in the transistors N16 and N17. Further, it will be noted from FIG. 2(h) that the second keeper output driver transistor N11 is quickly turned off by the assertion of the pulse signal HENB. This quick turn-off of the transistor N11 is achieved by the speed-up means formed by the transistors P9, N9, P10, and N10. This avoids common currents in the transistors N16 and N11 due to their simultaneous conduction, thereby reducing delay in the low-to-high transition, decreasing the transient supply currents, and preventing noise injection into the holding low supply voltage HVSS. With the transistor N16 being turned on, it performs the "pull up" function by providing current to the output node W from the high transient power supply voltage TVCC. This is illustrated in FIG. 2(d). At this point, the first keeper output driver transistor P11 has not begun to turn on. Thereafter, at the time t5 the transistor P11 will be turned on so as to maintain a high logic level on the output node W. This is depicted in FIG. 2(g).

When the signal LENB is again asserted at the time t6, the operation will be identical to that previously described except for the transistor P11. As can be seen in FIG. 2(g), there is a delay in the turning off of the transistor P11 until the time t7. This delay is caused by the same logic gates 24 and 28 functioning as the delay means. Thus, the transient pull-down output driver transistor N17 is turned on as the first keeper output driver transistor P11 is turned off, thereby creating a common current. However, by making the size of the transistor P11 to be much smaller than the size of the transistor N17 the common current will be very small, thereby causing negligible delay.

Therefore, it can be seen from the foregoing description of operation that the transient output driver transistors N16 and N17 are driving the output node W only for the duration of the respective pulses A (FIG. 2(b)) and B (FIG. 2(c)) and that the transition pull-up and pull-down circuits can be optimized for minimum assertion delay with deassertion delay being a relatively minor concern due to the separation of these pulses. Thereafter, the output driver transistors N11 and P11 in the keeper circuit 12 are used to maintain the drive with relatively smaller devices than the transient output driver devices. Since the smaller devices have a higher impedance, any inductive ringing or oscillation following the occurrence of the output transition will be damped more quickly than those designs using only transient output devices for maintaining the drive. Furthermore, in integrated circuits containing a plurality of these output buffers 10 the high transient supply voltage TVCC and the low transient supply voltage TVSS can be shared without generating supply induced cross-talk between the output buffers since the holding low supply voltage HVSS and the supply potential VCC are separated or isolated from the high transient supply voltage TVCC and the low transient supply voltage TVSS at the output node W. If the output buffers form a single bus, the holding low supply potential HVSS on the line 17 and the low transient supply voltage TVSS on the line 21 can be tied together since the problem of such cross-talk would not exist.

Figure 3:
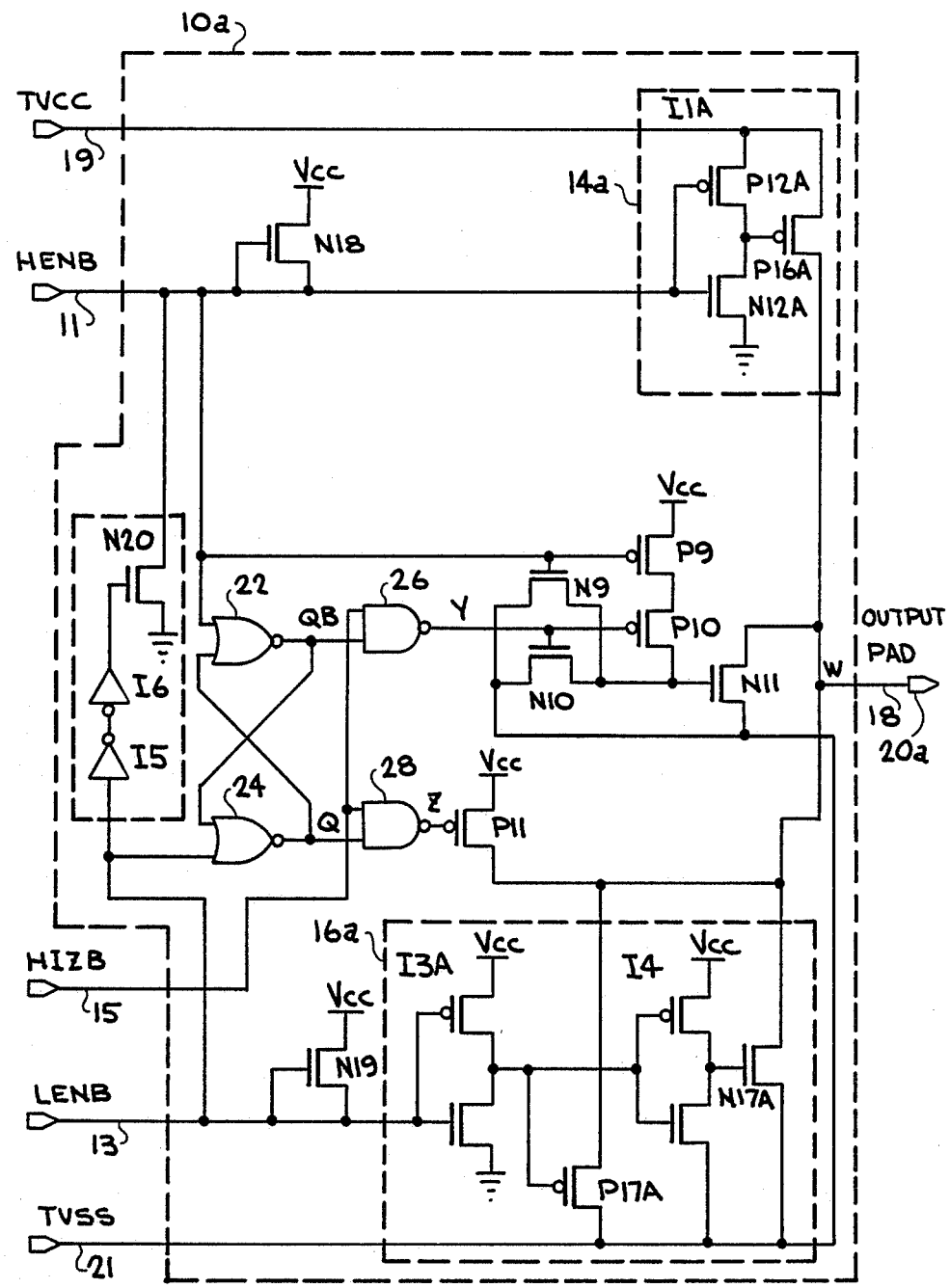
FIGS. 3-5 are schematic circuit diagrams of alternative embodiments of the present invention.

Referring now to FIG. 3, there is shown a schematic circuit diagram of an alternative embodiment of a CMOS output buffer constructed according to the present invention. Since the circuit of FIG. 3 is substantially identical to the circuit of FIG. 1, only the differences will now be discussed. Series-connected inverters I5 and I6 are interconnected between the line 13 and the gate of the transistor N20. If the line 13 is driven to a voltage sufficient to turn on the pull-down circuit 16a, the inverters I5 and I6 will cause the transistor N20 to turn on which will force the pulse signal HENB on the line 11 to a low voltage, thereby preventing the turning on of the pull-up circuit 14a and thus avoiding a conflicting drive to the pad 20a. The two inverters I1, I2 and the N-channel output drive transistor N16 in the pull-up circuit 14 of FIG. 1 have been replaced by a single inverter I1a formed of a P-channel MOS transistor P12a and an N-channel MOS transistor N12a, and a P-channel transient output driver transistor P16a.

Further, the N-channel output driver transistor N17 of FIG. 1 has been replaced by a smaller size N-channel transistor N17a and a P-channel transistor P17a. This serves to eliminate ringing at the output node W following a high-to-low transition and to reduce the peak transient current from the low transient supply voltage TVSS. The transistor P17a has its source connected to the output node W, its gate connected to the output of the inverter I3a, and its drain connected to the line 21. It should also be noted that the holding low supply potential HVSS and the low transient supply voltage TVSS are tied together at the line 21.

When the pulse signal LENB is asserted, the transistor P17a is turned on and takes the current in the low transient supply voltage TVSS near a peak level while at the same time reduces the voltage level at the output node W. As the transistor N17a begins to turn on, the transistor P17a begins to turn off due to the decreasing output voltage level. Thus, the total current from the low transient supply voltage TVSS remains essentially constant during most of this transition. As a result, the voltage level of the low transient supply voltage TVSS is returned quickly to zero so as to reduce oscillations in the low transient supply voltage TVSS as well as reducing ringing on the output node. Further, the smaller size of the transistor N17a yields a greater impedance that additionally damps oscillations. Except for these changes, the operation of the circuit in FIG. 3 is identical to the circuit of FIG. 1.

Figure 4:
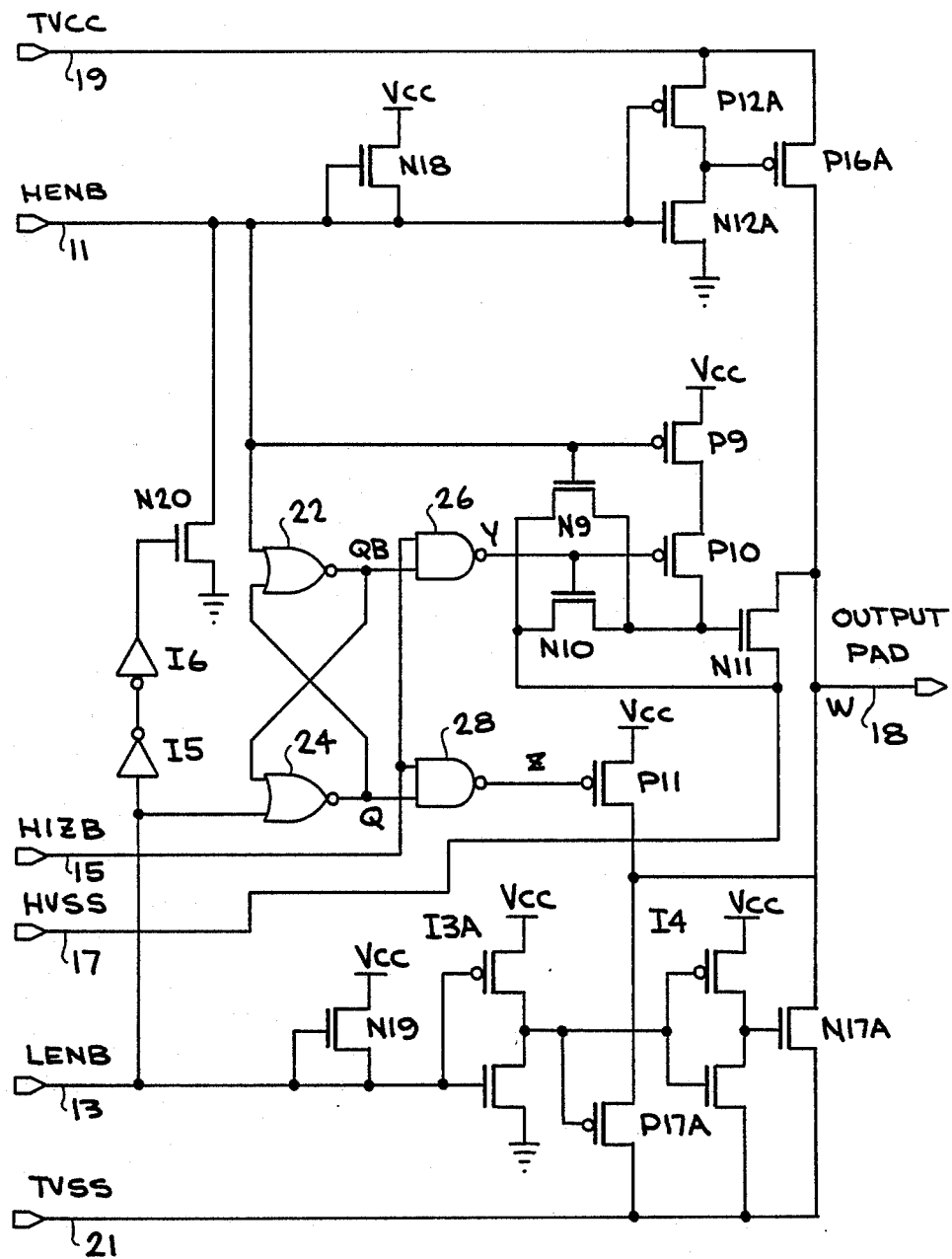

Referring now to FIG. 4, there is shown a schematic circuit diagram of another alternative embodiment of a CMOS output buffer constructed according to the present invention. The circuit of FIG. 4 is substantially identical to the circuit of FIG. 3, except that the holding low supply potential HVSS on the line 17 is separated from the low transient supply voltage TVSS on the line 21. Except for this change, the circuit components and their operation in FIG. 4 is identical to the circuit of FIG. 3 and thus will not be repeated.

Figure 5:
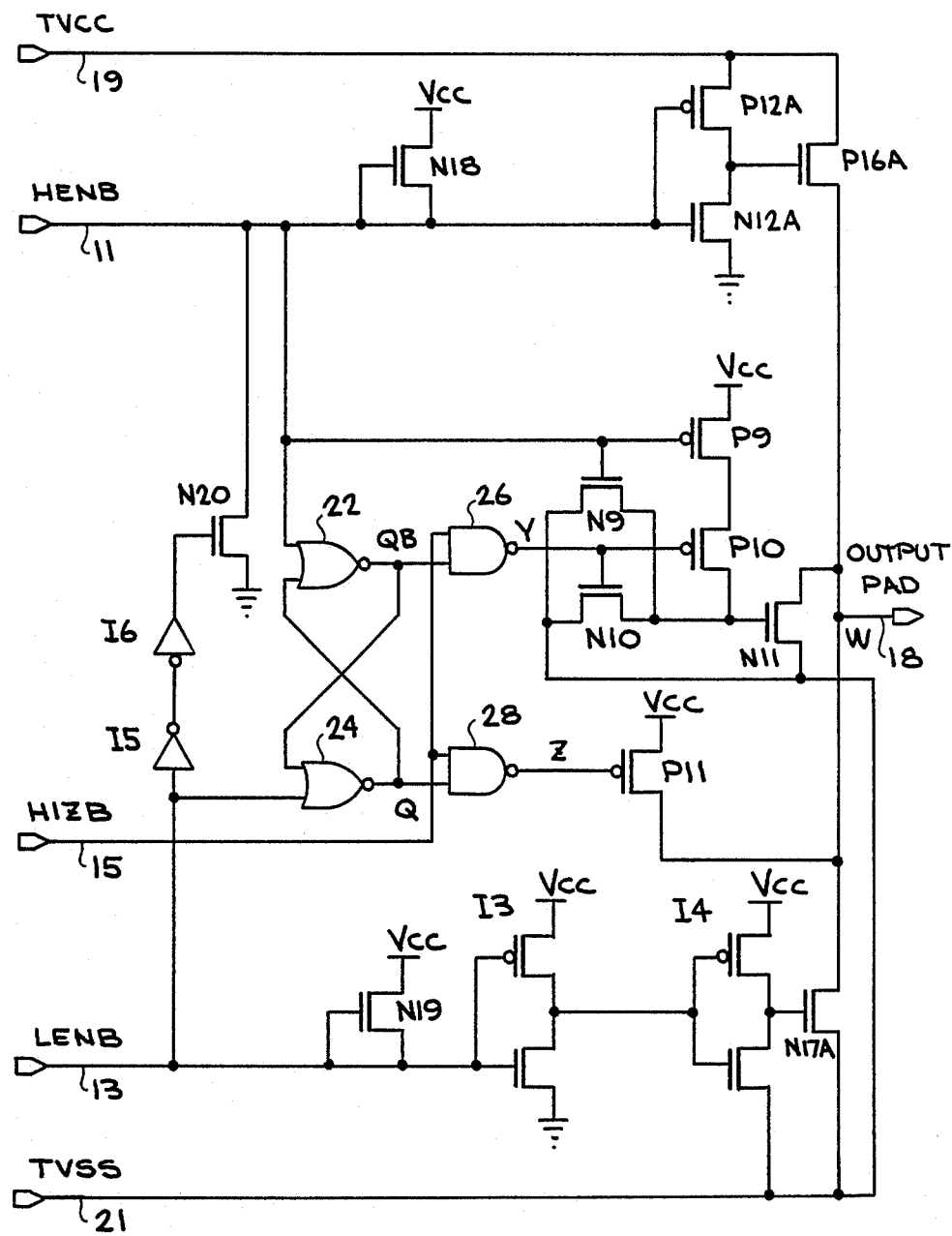

In FIG. 5, there is depicted a schematic circuit diagram of still another embodiment of a CMOS output buffer constructed according to the present invention. The circuit of FIG. 5 is substantially identical to the circuit of FIG. 3, except that the P-channel transistor P17a has been eliminated so as to reduce cost. Except for this difference, the circuit components and their operation in FIG. 5 is identical to the circuit of FIG. 3 and thus will not be discussed again.

While the transient pull-up output driver transistor N16 of FIG. 1 has been shown as an N-channel MOS transistor, it should be understood by those skilled in the art that this transistor could be replaced by a P-channel MOS transistor or a bipolar transistor. Similarly, the transient pull-down output driver transistor N17 of FIG. 1 could be replaced by a P-channel MOS transistor or a bipolar transistor.

From the foregoing detailed description, it can thus be seen that the present invention provides an improved CMOS output buffer which is formed of a transient pull-up circuit, a transient pull-down circuit, and a keeper circuit. The output buffer of the present invention has a high speed of operation and has a high immunity to noise.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. An improved CMOS output buffer comprising:
   transient pull-up circuit means responsive to a high drive enable pulse signal for generating a transition from a low logic level to a high logic level at an output node;
   said pull-up circuit means including a transient pull-up output driver transistor having one of its main electrodes connected to a high transient supply voltage, its other main electrode connected to the output node, and its control electrode coupled to receive the high drive enable pulse signal;
   transient pull-down circuit means responsive to a low drive enable pulse signal for generating a transition from the high logic level to the low logic level at the output node;
   said pull-down circuit means including a transient pull-down output driver transistor having one of its main electrodes connected to a low transient supply voltage, its other main electrode connected to the output node, and its control electrode coupled to receive the low drive enable pulse signal;
   keeper circuit means being responsive to the high and low drive enable pulse signals for maintaining the output node at the high logic level after the output node has made the low-to-high transition and for maintaining the output node at the low logic level after the output node has made the high-to-low transition;
   said keeper circuit means including a P-channel output driver MOS transistor and an N-channel output driver MOS transistor;
   said keeper circuit means further including delay means responsive to the high and low drive enable pulse signals and having first and second outputs for delaying the turning on of the N-channel output drive transistor until after the output node has completed the high-to-low transition;
   said P-channel output driver transistor having its source connected to a supply potential, its drain connected to the output node, and its gate coupled to the first output of said delay means;
   said N-channel output driver transistor having its drain connected to the output node, its source connected to a holding low supply voltage, and its gate coupled to the second output of said delay means;
   said keeper circuit means further including speed-up means responsive to the high drive enable pulse signal for quickly turning off the N-channel output drive transistor when the output node is making the low-to-high transition;
   said P-channel and N-channel output driver transistors being sized so as to be relatively smaller than said transient pull-up and pull-down output driver transistors;
   the turning on of the N-channel output drive transistor being delayed relative to the turning on of said transient pull-down output drive transistor during the high-to-low transition so that noise generated on the low transient supply voltage will be isolated from the holding low supply voltage; and
   said N-channel output drive transistor being quickly turned off when said transient pull-up output drive transistor is turned on so that noise generated on the high transient supply voltage during the low-to-high transition will be isolated from the holding low supply voltage.

2. An improved CMOS output buffer as claimed in claim 1, wherein said transient pull-up output driver transistor is an N-channel MOS transistor.

3. An improved CMOS output buffer as claimed in claim 2, wherein said transient pull-down output driver transistor is an N-channel MOS transistor.

4. An improved CMOS output buffer as claimed in claim 1, wherein said transient pull-up output driver transistor is a P-channel MOS transistor.

5. An improved CMOS output buffer as claimed in claim 4, wherein said transient pull-down output driver transistor is an N-channel MOS transistor.

6. An improved CMOS output buffer as claimed in claim 1, wherein said transient pull-up output driver transistor is a bipolar transistor.

7. An improved CMOS output buffer as claimed in claim 6, wherein said transient pull-down output driver transistor is a bipolar transistor.

8. An improved MOS output buffer as claimed in claim 1, wherein said delay means comprises a first NOR logic gate having first and second inputs and an output, a second NOR logic gate having first and second inputs and an output, a first NAND logic gate having first and second inputs and an output, and a second NAND logic gate having first and second inputs and an output, said first NOR gate having its first input connected to receive the high drive enable pulse signal, its second input connected to the output of said second NOR gate, and its output connected to the first input of said first NAND gate, said second NOR gate having its first input connected to receive the low drive enable pulse signal, its second input connected to the output of said first NOR gate, and its output connected to the first input of said second NAND gate, said first NAND gate having its second input connected to receive a high impedance control signal and its output coupled to the gate of said N-channel output driver transistor, said second NAND gate having its second input connected to receive the high impedance control signal and its output connected to the gate of said P-channel output driver transistor.

9. An improved CMOS output buffer as claimed in claim 8, wherein each of said first NOR gate, second NOR gate, first NAND gate, and second NAND gate is formed of a pair of P-channel MOS transistors and a pair of N-channel MOS transistors.

10. An improved CMOS output buffer as claimed in claim 1, further comprising first inverter means interconnected between the high drive enable pulse signal and the control electrode of said transient pull-up output driver transistor.

11. An improved CMOS output buffer as claimed in claim 10, further comprising second inverter means interconnected between the low drive enable pulse signal and the control electrode of said transient pull-down output driver transistor.

12. An improved CMOS output buffer as claimed in claim 10, wherein said transient pull-up transistor comprises an N-channel MOS transistor and wherein said first inverter means comprises a pair of series-connected CMOS inverters.

13. An improved CMOS output buffer as claimed in claim 10, wherein said transient pull-up transistor comprises a P-channel MOS transistor and wherein said first inverter means comprises a single CMOS inverter.

14. An improved CMOS output buffer as claimed in claim 11, wherein said transient pull-down transistor comprises an N-channel MOS transistor and wherein said second inverter means comprises a pair of series-connected CMOS inverters.

15. An improved CMOS output buffer as claimed in claim 1, further comprising diode means for preventing the high and low drive enable pulse signals from exceeding more than a single MOSFET threshold above the ground potential prior to power-up.

16. An improved CMOS output buffer as claimed in claim 15, wherein said diode means comprises a first diode-connected N-channel MOS transistor connected between the high drive enable signal and the supply potential, and a second diode-connected N-channel MOS transistor connected between the low drive enable pulse signal and the supply potential.

17. An improved CMOS output buffer as claimed in claim 1, further comprising means for preventing a conflicting drive to the output node during power-up.

18. An improved CMOS output buffer as claimed in claim 17, wherein said means for preventing the conflicting drive comprises an N-channel MOS transistor having its drain connected to the high drive enable pulse signal, its gate connected to the low drive enable pulse signal, and its source connected to the ground potential.

19. An improved CMOS output buffer as claimed in claim 14, further comprising a P-channel transistor having one of its main electrodes connected to the low transient supply voltage, its other main electrode connected to the output node, and its control electrode connected between the pair of series-connected CMOS inverters.

* * * * *